United States Patent [19]
Goela et al.

[11] Patent Number: 5,612,132
[45] Date of Patent: Mar. 18, 1997

[54] CHEMICAL VAPOR DEPOSITION-PRODUCED SILICON CARBIDE HAVING IMPROVED PROPERTIES

[75] Inventors: Jitendra S. Goela, Andover; Lee E. Burns, Woburn; Raymond L. Taylor, Saugus, all of Mass.

[73] Assignee: CVD, Incorporated, Woburn, Mass.

[21] Appl. No.: 455,007

[22] Filed: May 31, 1995

Related U.S. Application Data

[62] Division of Ser. No. 439,034, May 11, 1995, which is a division of Ser. No. 389,780, Feb. 16, 1995, abandoned, which is a continuation of Ser. No. 159,915, Nov. 30, 1993, abandoned, which is a continuation of Ser. No. 979,965, Nov. 23, 1992, abandoned.

[51] Int. Cl.$^6$ ..................................................... C01B 31/36
[52] U.S. Cl. .................... 428/332; 106/287.13; 423/345; 428/698
[58] Field of Search ..................................... 428/698, 332; 106/287.13; 423/345

[56] References Cited

U.S. PATENT DOCUMENTS

| | | | |
|---|---|---|---|
| 4,608,326 | 8/1986 | Neukermans et al. | 428/698 |
| 5,082,695 | 1/1992 | Yamada et al. | 422/249 |
| 5,225,032 | 7/1993 | Golecki | 156/612 |
| 5,254,370 | 10/1993 | Nagasawa et al. | 427/249 |
| 5,374,412 | 12/1994 | Pickering et al. | 423/346 |

OTHER PUBLICATIONS

Mutsui Product Literature; "Muhsic–Coat Mitsui Ultra High–purity SiC Coating".

Springer Proceedings in Physics, vol. 43, "Applications of High Purity SiC Prepared by Chemical Vapor Deposition", Y. Chinone, S. Ezaki, F. Fujita, and K. Matsumoto, pp. 198–206.

Primary Examiner—Archene Turner
Attorney, Agent, or Firm—Wayne E. Nacker; Gerald K. White

[57] ABSTRACT

β-silicon carbide which is optically transmitting in the visible and infrared regions is produced by chemical vapor deposition. Deposition conditions are temperatures within a 1400°–1500° C. range, pressure 50 torr or less, $H_2$/methyltrichlorosilane molar ratios of 4–30 and a deposition rate of 1 μm or less.

5 Claims, 4 Drawing Sheets

A comparison of transmission of CVD-βSiC (Run-9) with that of α-SiC single crystal. Sample thickness = 0.012-inch.

A schematic of CVD process used to fabricate SIC of improved transmission.

A comparison of transmission of CVD-βSiC (Run-9) with that of α-SiC single crystal. Sample thickness = 0.012-inch.

Schematics of deposition set-ups used to fabricate Improved transmission $\beta$-SiC.

CHEMICAL VAPOR DEPOSITION-PRODUCED SILICON CARBIDE HAVING IMPROVED PROPERTIES

This is a divisional of co-pending application Ser. No. 08/439,034, filed on May 11, 1995, pending, which is a divisional of U.S. application Ser. No. 08/389,780, filed Feb. 16, 1995, now abandoned, which is a continuation of U.S. application Ser. No. 08/159,915, filed Nov. 30, 1993, now abandoned, which is a continuation of U.S. application Ser. No. 07/979,965, filed Nov. 23, 1992, now abandoned.

The present invention is directed to silicon carbide produced by chemical vapor deposition processes having improved optical properties, including improved optical transmission, purity, and electrical resistivity, and to a deposition process for producing such silicon carbide.

BACKGROUND OF THE INVENTION

While single crystal $\alpha$-SiC exhibits some degree of optical transmission, polycrystalline $\beta$-SiC is substantially opaque. It would be desirable to provide $\beta$-SiC which optically transmits, particularly in the visible and infrared range. Optically transmitting SiC would have applications for lenses and domes, light detection and ranging (LIDAR) mirrors, solar collectors and concentrators, cathode covers (in the reactive ion etching systems), and astronomical mirrors. Single crystal $\alpha$-SiC is unsuitable for such bulk applications due to its size limitation; thus, it would be desirable to produce optically transmitting $\beta$-SiC which can be produced in bulk.

Known bulk silicon carbide is almost invariably opaque, absorbing and scattering light in the visible and infrared regions of the spectrum. Methods of producing bulk SiC include sintering and hot pressing, slip casting and reaction bonding. These methods are unlikely candidates for producing optically transmitting SiC as they suffer from one or more of the following drawbacks: 1) they produce a multiphase material, e.g., include a Si phase, 2) the material is not theoretically dense, and/or 3) the material is not of high purity and may contain metallic impurities that degrade optical transmission.

A better candidate for producing optically transmitting SiC, either free-standing bulk SiC or thin films on a substrate surface, is SiC produced by chemical vapor deposition (CVD). However, most of the SiC previously produced by CVD is opaque, exhibiting considerable scattering and absorption in the visible and infrared. Applicants are aware of efforts by the U.S. Air Force and General Electric to improve the infrared transmission of SiC by improving process parameters, such as substrate temperature, flow rates, furnace pressure etc. These efforts met with limited success. Although SiC transmitted in the 2–5 $\mu$m (infrared spectrum range), the material exhibited considerable scattering which made it unsuitable for use in imaging applications.

It is a general object of the present invention to produce $\beta$-SiC in bulk or thin film form having improved optical transmission. Other objects include providing CVD-SiC having heretofore unachieved purity, and electrical resistivity.

SUMMARY OF THE INVENTION

Bulk, free-standing, silicon carbide, fabricated by chemical vapor deposition (CVD), is optically transmitting in the visible and infrared range. Specific deposition parameters are required to produce the optically transmitting silicon carbide. This silicon carbide is highly pure, theoretically dense and has electrical resistivity in excess of SiC's previously known.

DETAILED DESCRIPTION OF CERTAIN PREFERRED EMBODIMENTS

Figure 1:
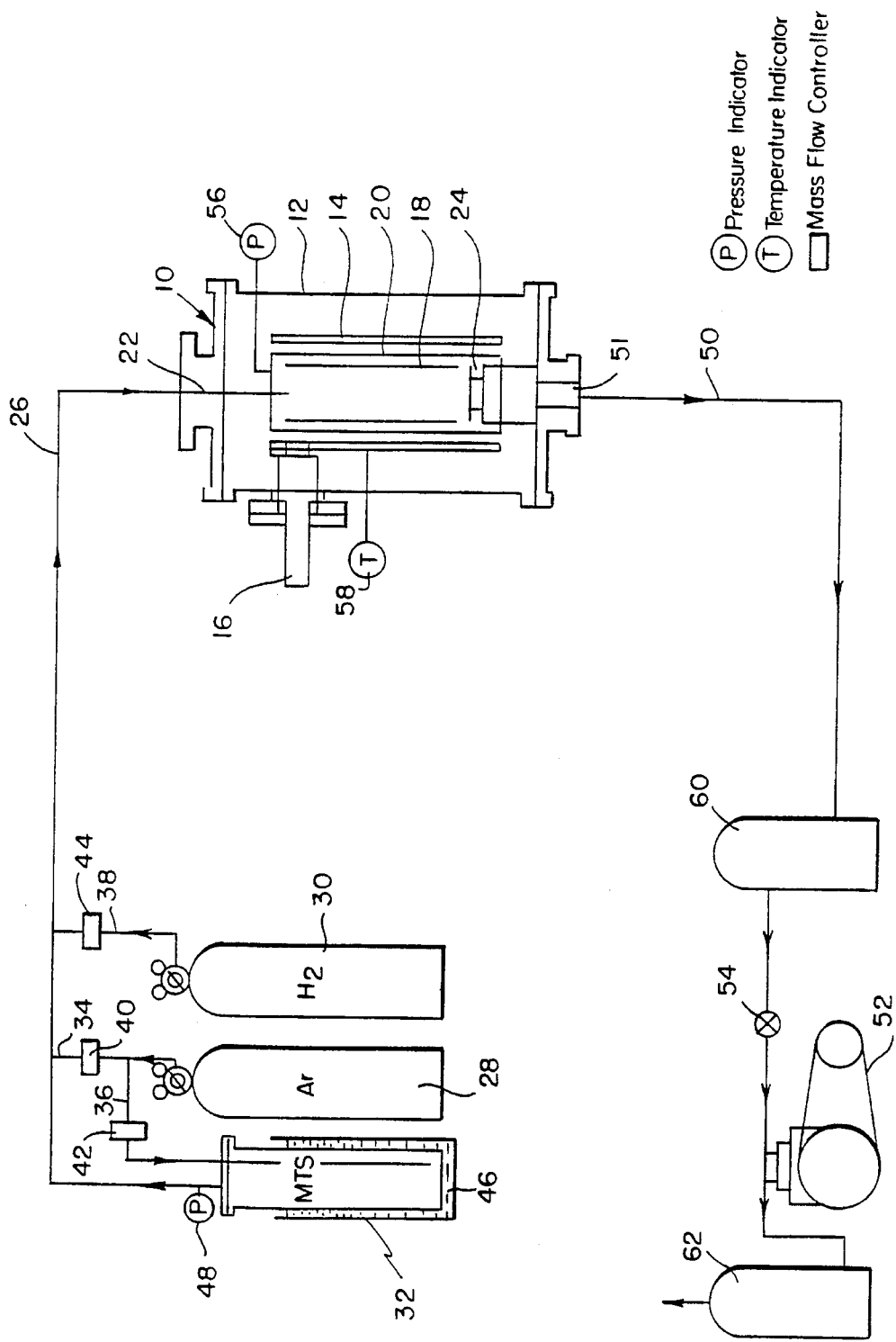
FIG. 1 is a schematic of CVD apparatus used to fabricate optically transmitting $\beta$-SiC.

Herein, unless otherwise noted, optical properties of silica carbide produced in accordance with the present invention are defined in terms of Attenuation Coefficients ($cm^{-1}$) at 0.6328 $\mu$m (visible-laser measured) and 3 $\mu$m (infrared-spectrophotometer measured). Attenuation coefficient is intended herein to include all optical losses, including both scattering and absorption. Attenuation coefficient is calculated as follows. If T, R, x are the transmittance, reflectance and material thickness, then the attenuation coefficient, $\beta$ is calculated from the following equation $$T = \frac{(1-R)^2 \exp(-\beta x)}{1 - R^2 \exp(-2\beta x)}$$

The reflectance is calculated from the refractive index (n).

$$R = \frac{(n-1)^2}{(n+1)^2}$$

The refractive index (n) is assumed to be 2.635 at 0.6328 $\mu$m and 2.555 at 3 $\mu$m.

Unless otherwise stated, properties of SiC produced in accordance with the invention are room temperature values, i.e., measured at 20°–28° C. (293°–301° K.). Although it is believed that thermal conductivity measurements are generally independent of the measuring technique, thermal conductivity values reported herein are those measured by flash-lamp techniques. Deposition chamber temperatures are measured by thermal probes within the deposition chamber placed closely adjacent the deposition site, e.g., a mandrel on which bulk free-standing SiC is to be deposited or a surface on which a film of SiC is to be deposited. Although the deposition site temperature may not be exactly that of the probe measured location, experience has found that probes closely adjacent, but differently located relative to a deposition site are almost always within 10° C. of each other and generally within 5° C. of each other. Thus, the deposition site is presumed to be within 50°–10° C. of the probed deposition chamber temperature.

The SiC to which the invention pertains is bulk or free-standing, i.e., capable of being self-supported. This is to be distinguished from thin SiC films which are deposited upon a surface with the intent that the SiC remain permanently bonded thereto. To be free-standing, the SiC must generally be deposited to a thickness of upward of about 0.1 mm.

Silicon carbide produced in accordance with the present invention has an attenuation coefficient at 0.6328 μm of about 20 cm$^{-1}$ or less, preferably about 10 or less, and more preferably about 8 or less. The silicon carbide has an attenuation coefficient at 3 μm of about 20 cm$^{-1}$ or less, preferably about 10 or less, more preferably about 8 or less and most preferably about 5 or less. It is believed that silicon carbide produced in accordance with the present invention is more optically transmitting at 0.6328 and 3 μm than any polycrystalline silicon carbide of the prior art. The silicon carbide in accordance with the invention is stoichiometric (1:1 Si:C ratio), 100% theoretical dense, and highly pure, i.e., about 5 ppm metallic impurities or less and preferably about 3.5 ppm metallic impurities or less. It is found that the higher is the purity, the greater is the optical transmittance of the SiC produced. Also high purity is very important for semiconductor furniture manufactured of CVD-SiC. High purity is achieved using high purity reaction materials, particularly O$_2$-free H$_2$ and contamination free grahite deposition set up. It has been demonstrated that distilling MTS from its as-purchased condition results in more optically transmitting CVD-deposited SiC.

Another feature of the SiC of the present invention is its very high bulk resistivity. Resistivity is an important attribute of material for electronic packaging. The upper limit of most non-doped SiC to date is about 100 ohm-cm, and CVD-SiC is not believed to have been consistently produced having resistivity of more than 100 ohm-cm. The resistivity of CVD-SiC according to the present invention has reached 4.53×10$^4$ ohm-cm. When SiC of such high electrical resistance is achievable, values lower than this value, yet still above that known in the prior art, is achievable, by introduction of impurities, e.g., through doping. Accordingly, novel CVD SiC is produced in accordance with the present invention having resistivity of 500 ohm-cm or greater, preferably 1000 ohm-cm or greater, and more preferably 10,000 ohm-cm or greater. Furthermore, the SiC produced in accordance with the invention is of the n-type, whereas most CVD-SiC is of the p-type. n-type is preferred as its resistivity tends to be constant over a broader temperature range.

Illustrated in FIG. 1 is an apparatus useful for fabricating CVD-β-SiC. Deposition is carried out within a furnace 10. A stainless steel wall provides a cylindrical deposition chamber 12. Heating is provided by a graphite heating element 14 which is connected to an external power supply by an electrode 16. Graphite deposition mandrels are arranged within a graphite isolation tube 20 and gas is introduced by means of an injector 22 through the upper end of the isolation tube so that the reaction gases sweep along the mandrels 18. One or more baffle(s) 24 is used to control the aerodynamics of gas flow through the furnace.

The line 26 which supplies the injector is fed by an argon cylinder 28, a hydrogen cylinder 30, and a MTS bubbler 32. The argon is fed by lines 34 and 36 both directly to inlet line 26 and through the bubbler 32. The hydrogen cylinder is connected by a line 38 to the inlet line 26. Argon flow through lines 32 and 36 and hydrogen flow through line 38 are controlled by mass flow controllers 40, 42 and 44. The MTS cylinder 32 is maintained at a constant temperature by a constant temperature bath 46. A pressure gauge 48 is connected to a feed back loop which controls the gas pressure of the bubbler 32.

An outlet line 50 is connected to a bottom outlet port 51. Pressure within the deposition chamber 12 is controlled by a vacuum pump 52 which pulls gases through the chamber and a furnace pressure control valve 54 operably connected to the vacuum pump. The temperature and pressure within the deposition chamber 12 are measured by a thermal probe 58 and a pressure indicator 56. Exhaust gases are passed through a filter 60 to remover particulate material upstream of the pressure control valve and through a scrubber 62 downstream of the vacuum pump to remove HCl.

Figure 3A:
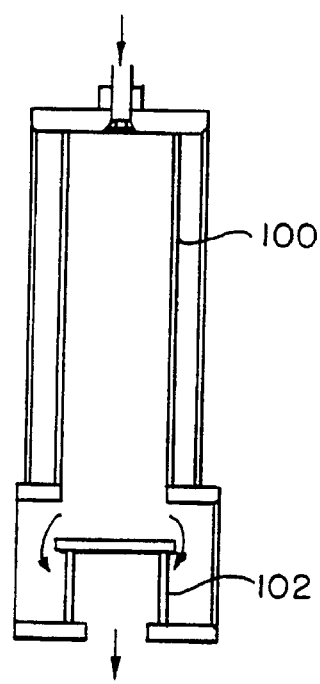
FIGS. 3a, 3b and 3c illustrate different baffle/mandrel arrangements used within the deposition chamber of a furnace for the fabrication of CVD-$\beta$-SiC.
Figure 3B:
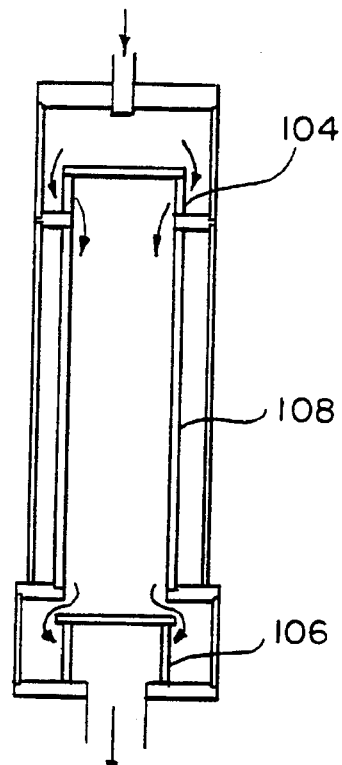
Figure 3C:
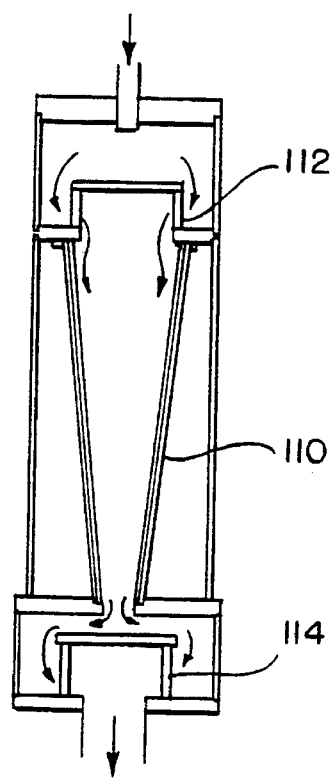

As discussed below in the examples, particularly with respect to FIGS. 3a, 3b and 3c, the arrangement of baffles may be varied to produce desired results. The results discussed below with respect to FIGS. 3a, 3b and 3c are particular to the furnace in which the SiC was deposited and may vary from furnace to furnace and also the configuration of the mandrel or substrate on which SiC of desired configuration is to be deposited.

To obtain optically transmitting CVD-deposited β-SiC, a deposition chamber temperature of between about 1400° and about 1500° C., preferably between about 1400° and about 1450° C. is employed. The deposition chamber pressure is about 50 torr or lower, preferably about 10 torr or lower and most preferably about 5 torr or lower. The H$_2$/MTS ratio is from about 4 to about 30, preferably from about 10 to about 20. The deposition rate is about 1 micron per minute or less; it is believed that this very low deposition rate is critical to obtain β-SiC with good optical transmittance. The rate at which the deposition surface is swept by the reactant gases also appears to affect the optical transmittance of the deposited SiC. Although optically transmitting SiC has been produced with average flow velocities of about 10 cm/sec, it is preferred that flow velocities be at least about 300 cm/sec, and more preferably at least about 1000 cm/sec. Sweep velocity, which is the gas velocity at the deposition surface, is a function not only of the flow rate of gases into the furnace, but of the furnace design and orientation of the deposition surface(s) within the deposition chamber of the furnace.

HCl is a reaction product of the deposition of SiC using MTS and H$_2$ as the reaction gases. It is found that adding gaseous HCl to the gas stream that is introduced into the reaction chamber further improves the optical transmission of the CVD-β-SiC which is produced. To have a significant effect on transmission of the SiC, the HCl/MTS molar ratio is generally at least about 0.2.

The invention will now be described in greater detail by way of specific examples in the experiments described below.

EXAMPLE 1

Several depositions of SiC were performed in a CVD reactor to fabricate CVD-SiC with improved transmission. In these depositions, the CVD process conditions and the deposition set-up were varied to optimize the vis-IR transmission of CVD-SiC. The process conditions used were: substrate temperature: 1400°–1470° C., furnace pressure: 3–200 torr, flow rates—MTS: 0.1–2.8 slpm (standard liters per minute), H$_2$: 0.5–5.8 slpm. H$_2$/MTS molar ratio: 4–30, and average flow velocity=14–1260 cm/sec.

The CVD-SiC was characterized for vis-IR transmission. The SiC transmission was determined to be dependent upon MTS purity, CVD process conditions and CVD deposition geometry. The commercially available MTS of 99% purity contains metallic impurities which end up in the CVD-SiC and degrade its near-IR transmission. Distillation of MTS in a narrow temperature range around its boiling point has resulted in fabricating SiC which exhibits good transmission in the infrared region.

Table 1 below shows the attenuation coefficient values for CVD-SiC at 0.6328 μm and 3 μm as a function of furnace pressure. It is seen that as the pressure decreases from 200 torr to 10 torr, both visible and infrared attenuation coefficients decrease, i.e., transmittance in both visible and infrared regions increase. Although Run #11 (furnace pressure=3 torr), material showed an increase in attenuation coefficient in comparison to Run #7 (furnace pressure=10 torr), this increase may be due to the deposition set-up which was changed.

The effects of varying other CVD process parameters on transmission were less clear. Optimum results were obtained for the following process conditions. Substrate temperature: 1425° C., Furnace pressure: 10 torr, Flow rate: MTS=0.19 slpm, $H_2$=2.8 slpm, Ar=1.0 slpm, $H_2$/MTS molar ratio=15 and average flow velocity=365 cm/sec.

Three deposition set-ups were tried in an effort to maximize the transmission of CVD-SiC. These set-ups are shown in FIG. 3a, 3b and 3c. All these set-ups yielded CVD-β-SiC with improved transmission at different parts of the deposition region. Two setups (FIGS. 3a,b) used four rectangular mandrel plates, 3.5 in.-wide×12 in.-long, arranged in the form of an open square box.

The deposition set-up of FIG. 3a consisted of a mandrel box 100 at the end of which was placed a graphite baffle 102. In this case, porous material was deposited on the mandrel while dense and good quality β-SiC was obtained on the baffle. It is believed that the porous material was deposited because (i) the reagents were "cold," i.e., there was considerable temperature difference between the mandrel and the gaseous reagents and (ii) the reagent sweep speed on the mandrel walls was small. This explanation is consistent with the observation that the material on the upper half of the mandrel was more porous than on the lower half.

In FIG. 3b two baffles were used, one 104 before and the other 106 after the mandrel box. The function of the first baffle 104 is to preheat the reagents and direct the gas close to the mandrel walls to increase reagents sweep speed along the mandrel box 108. This deposition set-up produced CVD β-SiC with good vis-IR transmission. The "best" material was produced on the upper half of the the mandrel box. The deposited material on other areas had better transmission than that produced at other CVD conditions.

In the deposition set-up of FIG. 3c, the two walls of the mandrel box 110 were tapered. The cross-section of the mandrel box was a square 3.5 in.×3.5 in. on the top end and a rectangle 3.5 in.×1.05 in. at the bottom end. The aim of using this tapered box was to continuously reduce the cross-section and thus increase the flow velocity to study its effect on the quality of the material. This set-up also employed a baffle 112 before and a baffle 114 after the mandrel box. Although this configuration also produced good optical quality CVD-SiC, considerable stress in the material was observed and the deposited material exhibited substantial bowing.

TABLE I

Attenuation Coefficient of CVD-βSiC as Function of Furnace Pressure

| Run No. | Furnace Set-Up | Furnace Pressure (Torr) | Attenuation Coefficient (cm$^{-1}$) @ 0.6328 μm | @ 3 μm | Avg Velocity cm/sec |
|---|---|---|---|---|---|
| 2 | 3a | 200 | 30 | 40 | 49 |
| 3 | 3b | 200 | 66 | 24 | 21 |
| 4 | 3b | 40 | 19 | 21 | 197 |
| 5 | 3c | 20 | 16 | 14 | 272–761 |
| 7 | 3b | 10 | 7.3 | 3.5 | 365 |
| 11 | 3b | 3 | — | 7.6 | 1260 |

EXAMPLE 2

Addition of HCl to the reaction mixture is found to suppress formation of Si-rich SiC. The CVD process conditions were: substrate temperature=1413°–1423° C., Furnace pressure: 3–7 torr, flow rates—$H_2$:2.8 slpm, MTS: 0.19 slpm, Ar: 1.0 slpm, HCl: 0.15–6.0 slpm, $H_2$/MTS molar ratio: 15, HCl/$H_2$ molar ratio=0.054–0.21 and an average flow velocity: 540–1260 cms$^{-1}$. The deposition set-up used was the two-baffle configuration of FIG. 3b. Table 2 below lists the attenuation coefficient values that were obtained when HCl was added to the reagent mixture. A comparison of attenuation coefficient for Run #10 and #11 (Table 1) clearly shows improved optical transmission values when HCl is added. Further, similar to Example 1, the vis-IR transmittance of CVD-SiC increased as the furnace pressure decreased.

TABLE 2

Attenuation Coefficient of CVD-βSiC when HCl is Added to the Reaction Mixture

| Run No. | Furnace Setup | Furnace Pressure (Torr) | Attenuation Coefficient (cm$^{-1}$) @ 0.6328 μm | @ 3 μm | Average Velocity cm/sec |
|---|---|---|---|---|---|
| 9 | 3b | 7 | 7.4 | 2.8 | 540 |
| 10 | 3b | 3 | 6.9 | 2.1 | 1260 |

Figure 2:
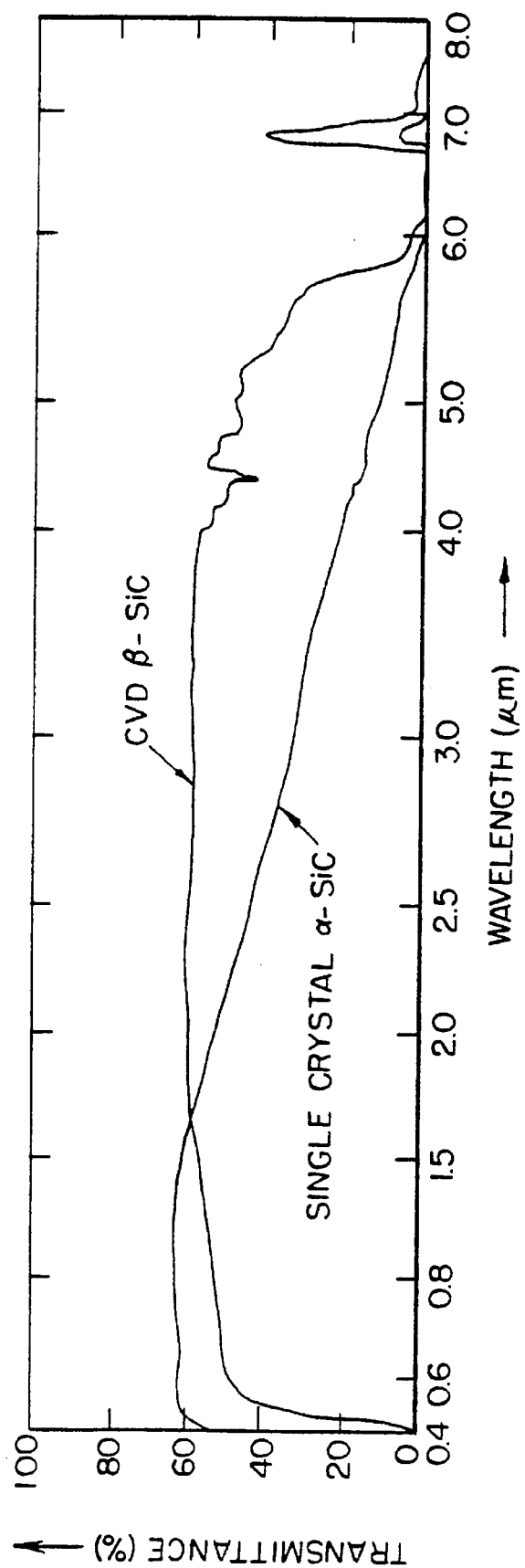
FIG. 2 is a graph comparing the transmission of CVD-$\beta$-SiC with the transmission of $\alpha$-SiC.

FIG. 2 shows a comparison of transmission of β-SiC with that of commercially available α-SiC single crystal sample. Both samples are 0.012-inch thick. It is seen that CVD-β SiC performs considerably better than single crystal α-SiC in the near-IR region while the latter material performs better in the visible region.

Figure 4:
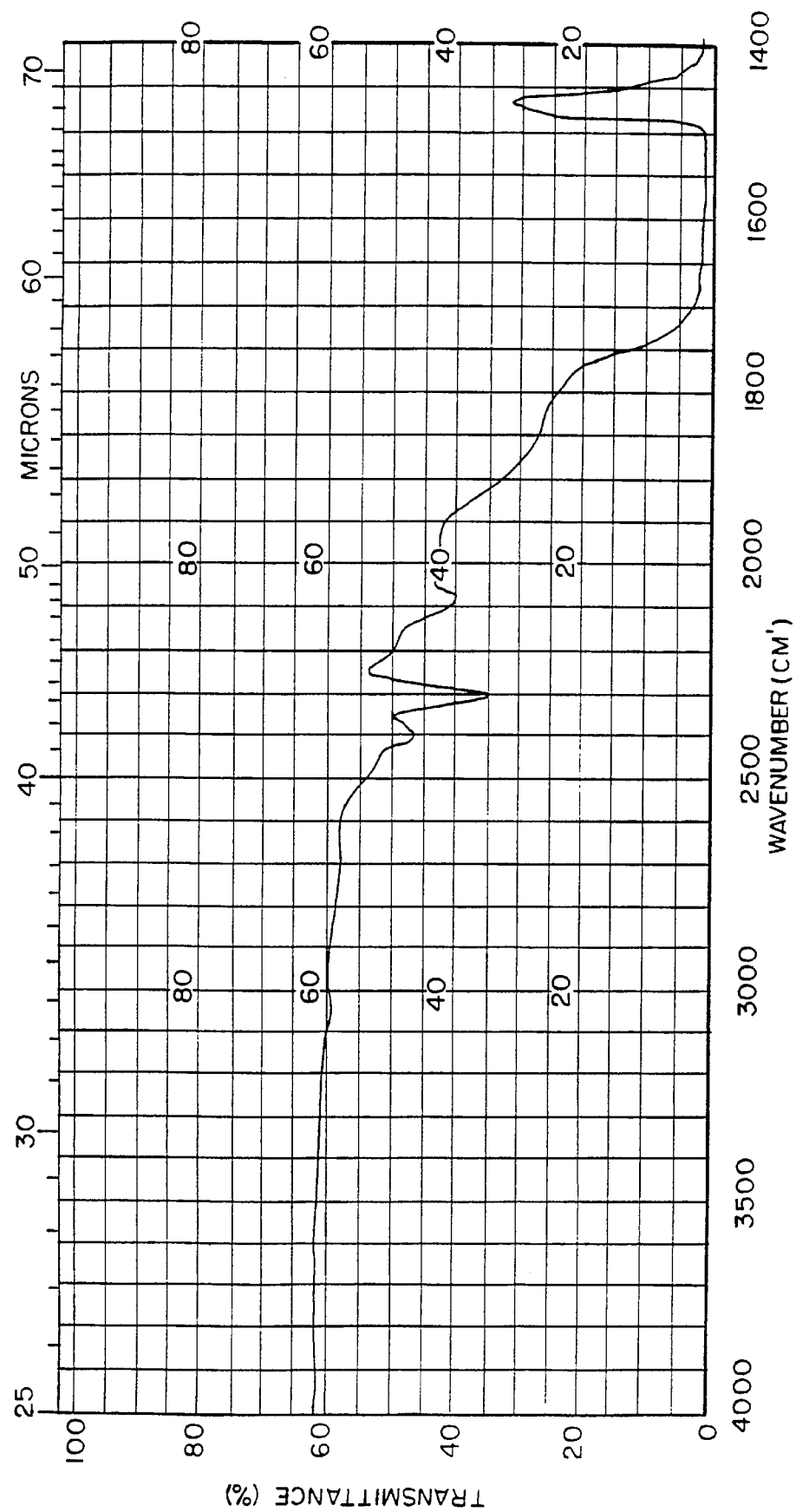
FIG. 4 is a transmission spectrum of a highly optically transmitting CVD-$\beta$-SiC.

FIG. 4 shows infrared transmission of CVD-SiC when HCl is added to the reaction mixture (Run #10). The thickness of the sample was about 0.022-inch. 60% transmission is seen in the near IR region which corresponds to an attenuation coefficient of 2.1 cm$^{-1}$ at 3 μm. This is believed to be the lowest value of specular attenuation coefficient that has ever been achieved for polycrystalline CVD-βSiC free-standing sample. This material was also characterized for hardness and fracture toughness and yielded values of Vickers hardness (Kg mm$^{-2}$)=2700±58.8 with 1 Kg load and fracture toughness (MN m$^{-3/2}$)= 2.23±0.043. These values are typical of CVD-SiC. Thus, an improvement in optical properties has been obtained without degrading other properties such as hardness and fracture toughness.

While the invention has been described in terms of certain preferred embodiments, modifications obvious to one with ordinary skill in the art may be made without departing from the scope of the invention.

Various features of the invention are set forth in the following claims.

What is claimed is:

1. Polycrystalline chemical vapor deposited β-SiC having an attenuation coefficient at 0.6328 μm of about 20 cm$^{-1}$ or less and having a thickness of at least about 0.1 mm.

2. SiC according to claim 1 having an attenuation coefficient at 0.6328 μm of about 10 cm$^{-1}$ or less.

3. SiC according to claim 1 having an attenuation coefficient at 0.6328 μm of about 8 cm$^{-1}$ or less.

4. Polycrystalline chemical vapor deposited β-SiC having an attenuation coefficient at 3 μm of about 2.8 cm$^{-1}$ or less and having a thickness of at least about 0.1 mm.

5. SiC according to claim 4 having an attenuation coefficient at 3 μm of about 2.1 cm$^{-1}$ or less.

* * * * *

UNITED STATES PATENT AND TRADEMARK OFFICE
CERTIFICATE OF CORRECTION

PATENT NO. : 5,612,132
DATED : March 18, 1997
INVENTOR(S) : Jitendra S. Goela, Lee E. Burns, Raymond L. Taylor It is certified that error appears in the above-indentified patent and that said Letters Patent is hereby corrected as shown below:

Column 2, line 59, " $50^0 - 10^0$ " should read -- $5 - 10^0$ --.

Signed and Sealed this

Fourteenth Day of October, 1997

Attest:

BRUCE LEHMAN

Attesting Officer

Commissioner of Patents and Trademarks